US006923924B2

(12) United States Patent
Sano et al.

(10) Patent No.: US 6,923,924 B2
(45) Date of Patent: Aug. 2, 2005

(54) COPPER PARTICLE CLUSTERS AND POWDER CONTAINING THE SAME SUITABLE AS CONDUCTIVE FILLER OF CONDUCTIVE PASTE

(75) Inventors: Kazushi Sano, Okayama (JP); Yoshihiro Okada, Okayama (JP); Hiromasa Miyoshi, Okayama (JP); Yoshiomi Takada, Hachioji (JP)

(73) Assignee: Dowa Mining Co., Ltd., Tokyo (JP)

( * ) Notice: Subject to any disclaimer, the term of this patent is extended or adjusted under 35 U.S.C. 154(b) by 133 days.

(21) Appl. No.: 10/633,556

(22) Filed: Aug. 5, 2003

(65) Prior Publication Data

US 2004/0026669 A1 Feb. 12, 2004

Related U.S. Application Data

(62) Division of application No. 09/741,024, filed on Dec. 21, 2000, now Pat. No. 6,620,344.

(30) Foreign Application Priority Data

Dec. 21, 1999 (JP) ............................................ 11-362304

(51) Int. Cl.$^7$ .............................................. H01B 1/22
(52) U.S. Cl. .................................................... 252/512
(58) Field of Search ................................. 252/512, 514

(56) References Cited

U.S. PATENT DOCUMENTS

| 4,122,143 A | 10/1978 | Momotari et al. |
| 4,776,978 A | 10/1988 | Herron et al. |
| 5,769,996 A | 6/1998 | McArdle et al. |
| 5,807,508 A * | 9/1998 | Kawahara et al. .......... 252/512 |
| 6,423,172 B1 | 7/2002 | McArdle et al. |

FOREIGN PATENT DOCUMENTS

| JP | 62-99406 | 5/1987 |
| JP | 2-197012 | 8/1990 |
| JP | 4-116109 | 4/1992 |

* cited by examiner

Primary Examiner—Mark Kopec
(74) Attorney, Agent, or Firm—McDermott Will & Emery LLP

(57) ABSTRACT

Copper particle clusters constituting a powder suitable for making a conductive paste are provided that are individually composed of not fewer than two and not more than 20 unit particles joined through neck portions. A conductive paste made from the powder is excellent in conductivity. A conductive filler for conductive paste is provided that consists essentially of a mixture of copper particle clusters A individually composed of two or more unit particles joined through neck portions and spherical metallic particles B of smaller diameter than the particles A. A conductive paste made from the filler is low in viscosity and excellent in conductivity.

8 Claims, 6 Drawing Sheets

15 μm

COPPER PARTICLE CLUSTERS AND POWDER CONTAINING THE SAME SUITABLE AS CONDUCTIVE FILLER OF CONDUCTIVE PASTE

This application is a DIV of Ser. No. 09/741,024 (filed Dec. 21, 2000, now U.S. Pat. No. 6,620,344).

BACKGROUND OF THE INVENTION

1. Field of the Invention

This invention relates to copper particle clusters and powder containing the same suitable for use as the conductive filler of a conductive paste.

2. Background Art

In the fabrication of thick-film circuit boards and the like by screen-printing a conductive paste on an insulating board, the silver-system paste long used as the main conductive paste has recently been replaced to some extent by copper-system paste. Copper-system paste has certain advantages over silver-system paste, including higher resistance to migration, excellent soldering tolerance, and low cost. A copper-system conductive paste having these advantages is obtained by dispersing copper powder of a particle diameter of about 0.1–10 μm in a vehicle (resin binder).

Copper paste using copper powder as metallic filler has also drawn particular attention in connection with the recent practice of fabricating multi-layer boards for high-density component mounting by forming stacked boards with through-holes or via holes in the shape of fine holes or slits, charging conductive paste into these openings, and solidifying the conductive paste by heating to form high-density conductive circuits in the boards. Copper paste can be used to advantage as the conductive paste charged into the small hole-like or slit-like openings.

Known processes of producing copper powder include the mechanical pulverization process, atomization process of spraying molten copper, electrolytic cathode deposition process, vapor deposition process and the wet reduction process. Although each method has its merits and demerits, the wet reduction process is the main one used to produce copper powder for conductive paste because it enables relatively ready production of fine powder of a particle diameter suitable for use in a conductive paste. Copper powder production processes using the wet reduction method are taught by, for instance, Japanese Patent Publication JPA No.Hei 4-116109 (1992), JPA No.Hei 2-197012 (1990) and JPA No.Shou 62-99406 (1987).

Although copper-system paste rates highly in various aspects of performance, its most basic requirement for use as a conductive paste is excellent conductivity. When a metallic filler of a given purity is dispersed in a resin at a given filling rate, the electrical resistance of the resulting paste will nevertheless exhibit different values depending the particle size distribution and particle shape. In order to obtain a paste with low electrical resistance, it is obviously important to ensure close contact among the particles, i.e., to ensure that the metallic particles are dispersed in the resin at a high filling rate so as to increase the contact interface among the particles. Although obvious, this is hard to achieve in practice while also maintaining the other qualities required by the conductive paste, such as good viscosity property.

Low electrical resistance can generally be obtained when the metallic filler in the resin includes many particles with irregular surfaces because the surface irregularities increase the contact area among the particles. However, a paste containing a large percentage of particles with pronounced surface irregularities is high in viscosity and therefore difficult to charge into the through-holes or via holes. Simultaneous reduction of electrical resistance and viscosity is therefore difficult because an attempt to lower electrical resistance by controlling particle shape has the adverse effect of increasing paste viscosity.

A first object of the present invention is to provide copper particles/powder that exhibit high conductivity (low electrical resistance) when dispersed in a resin.

A second object of the present invention is to provide copper particles/powder that exhibit high conductivity (low electrical resistance) and minimize viscosity increase when dispersed in a resin.

SUMMARY OF THE INVENTION

The present invention achieves the first object by providing copper particle clusters for conductive paste individually composed of two or more unit particles, preferably 2 to 20 unit particles, joined through neck portions. The individual copper particle clusters for conductive paste provided by the present invention are preferably composed 2 to 20 unit particles of about 0.5–10 μm diameter joined through neck portions in arbitrary directions in three-dimensional space. A "neck portion" is defined as a portion through which two unit particles are joined which is of a diameter smaller than the diameter of at least one of the unit particles joined thereby, preferably smaller than the diameters of both unit particles joined thereby.

A metallic copper powder composed of such copper particle clusters can be advantageously produced by a process for producing copper powder comprising a step of precipitating copper hydroxide by reacting an aqueous solution of a copper salt and an alkali to obtain a suspension containing copper hydroxide, an intermediate reduction step effected by adding a reducing agent to the suspension to reduce the copper hydroxide to cuprous oxide, and a final reduction step of reducing the cuprous oxide in the suspension to metallic copper using a reducing agent, in which process the copper hydroxide precipitating step is conducted under an atmosphere of an oxygen-containing gas, the copper hydroxide precipitating step is conducted in an aqueous solution of an Fe concentration of not greater than 50 ppm, and an oxygen-containing gas is blown into the suspension containing cuprous oxide after the intermediate reduction step.

The present invention achieves the second object by providing a copper powder for conductive paste (conductive filler) composed of copper particle clusters with neck portions and metallic particles without neck portions. More specifically, the invention provides a filler for conductive paste capable of simultaneously lowering electrical resistance and viscosity consisting essentially of a mixture of copper particle clusters A individually composed of two or more unit particles joined through neck portions and spherical metallic particles B of smaller diameter than the particles A. The spherical metallic particles B are preferably mixed with a copper powder comprising the copper particle clusters A at a rate such that the weight ratio of B to A (B/A) is in the range of 1/19 to 3/5, and the ratio of the average particle diameter $D_A$ of the copper particle clusters A to the average particle diameter $D_B$ of the spherical metallic particles B ($D_A/D_B$) is in the range of 5/4 to 8/1. The spherical metallic particles B can be copper particles or copper particles coated with silver. The average particle diameter $D_A$ of the copper particle clusters A is preferably in the range of 4–8 μm. The copper powder comprising the copper particle clusters A is still more preferably one that has been subjected to surface smoothing treatment. The surface smoothing can be achieved by causing mechanical contact among the copper particle clusters A. When the copper particle clusters A are ones that have been subjected to surface smoothing treatment, the copper particle clusters may be present whose neck diameter is greater than the diameter of at least one of the unit particles at opposite ends of the neck portion. The second object can also be achieved in this case because the improved fluidity of the filler produced by the surface smoothing reduces the paste viscosity.

DESCRIPTION OF THE PREFERRED EMBODIMENTS

Figure 1:
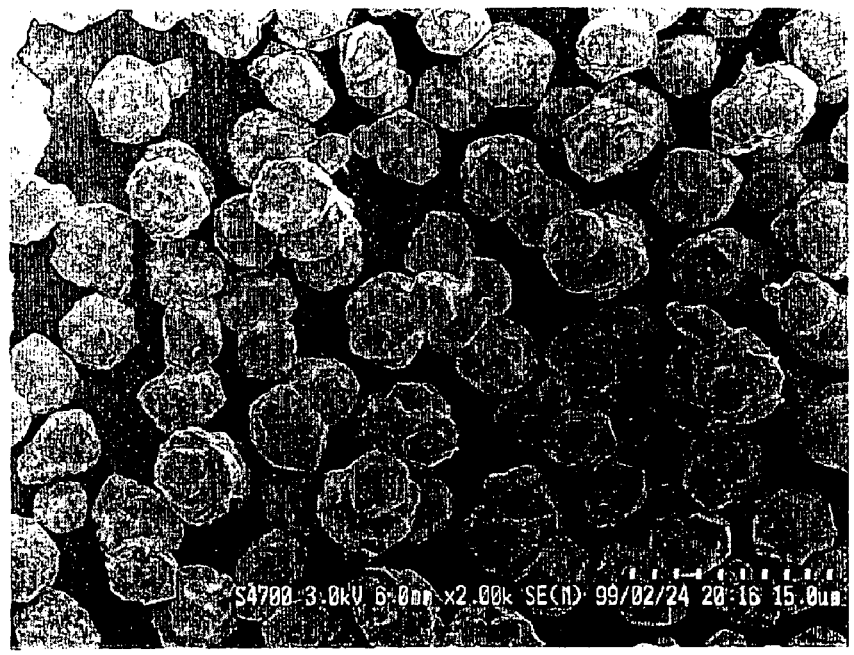
FIG. 1 is a scanning electron microscope (SEM) image of metallic copper powder obtained in Example 1 according to the invention.
Figure 2:
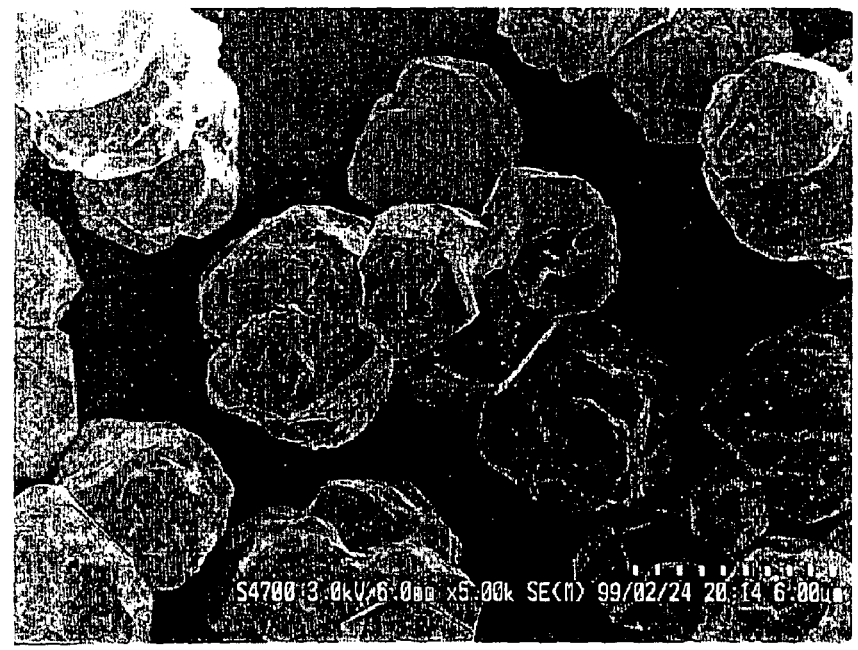
FIG. 2 is an enlarged SEM image of particles at the middle of FIG. 1.

FIGS. 1 and 2 are scanning electron microscope (SEM) images of a metallic copper powder in accordance with the present invention obtained in a working Example set out later. FIG. 2 is an enlarged SEM image of particles at the middle of FIG. 1. The copper particle cluster at the center of FIG. 2 can be considered to consist of 7 unit particles of about 2.4–5 μm diameter joined in random directions in three-dimensional space via neck portions. The diameters of the neck portions are smaller than the diameters of the unit particles located at their opposite ends. As can be seen in FIG. 1, this copper particle cluster composed of 7 unit particles is one among various sized copper particle clusters consisting of 1, 2, 3 . . . n unit particles (1 indicating an individual unit particle not joined to any other and n having a maximum value of around 20 in FIG. 1). The unit particles of the multi-particle clusters are not in mere point contact but are interconnected through neck portions constituting a certain amount of connection area. The mechanical strength of the neck portions is sufficient to prevent separation of the unit particles joined thereby when the copper particle clusters experience impacts of a degree occurring during normal handling, such as when the powder flows during pouring or the like. A conductive paste prepared from a copper powder containing copper particle clusters joined via such neck portions was found to exhibit markedly lower electrical resistance than one not containing such copper particle clusters.

Figure 3:
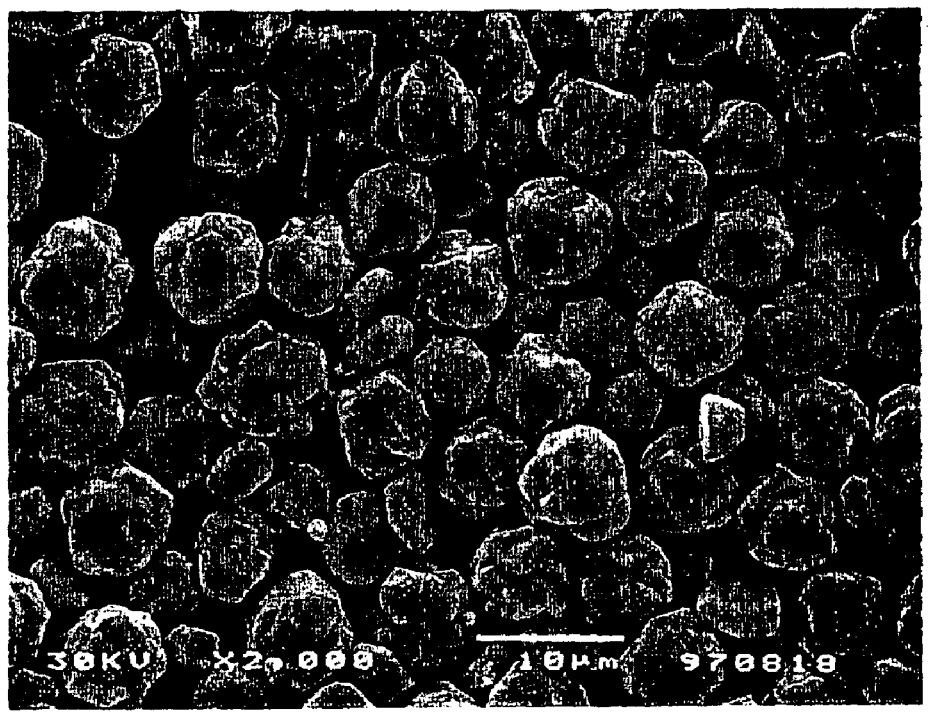
FIG. 3 is an SEM image of metallic copper powder obtained in Comparative Example 1.
Figure 4:
FIG. 4 is an enlarged SEM image of particles at a location slightly above the middle of FIG. 3.

FIGS. 3 and 4 are scanning electron microscope (SEM) images of a metallic copper powder obtained in a Comparative Example set out later. FIG. 4 is an enlarged SEM image of particles at a location slightly above the middle of FIG. 3. This copper powder can be considered not to contain copper particle clusters with neck portions but to consist of approximately spherical (ball-shaped) particles of 2–10 μm diameter. The distribution of the particles is substantially uniform and the average particle diameter is about 6.0 μm.

Pastes prepared by dispersing equal amounts of the metallic copper powders in equal amounts of the same type of resin were measured under identical conditions for electrical resistance (volume resistivity of dried coating). As indicated in the examples set out later, the paste prepared from the metallic copper powder shown in FIGS. 1 and 2 (hereinafter called the "former paste" and "former powder") exhibited electrical resistance of $3.12 \times 10^{-3}$ Ω·cm, while that prepared from the metallic copper powder shown in FIGS. 3 and 4 (hereinafter called the "latter paste" and "latter powder") exhibited electrical resistance of $2.76 \times 10^{-2}$ Ω·cm. The former paste thus exhibited electrical resistance of an order of magnitude smaller than the later and was therefore excellent in conductivity.

The reason for this is not completely clear but is thought to be that the certainty of the connectivity among the unit particles of the metallic copper powder including copper particle clusters was greater in proportion to the number of copper particle clusters contained therein, so that better overall filling of the resin was achieved owing to increased contact interface among the particles and also to the presence of smaller copper particle clusters and individual unit particles between larger copper particle clusters. However, a metallic copper powder similar to the former powder except that it comprised copper particle clusters composed of more than 20 interconnected unit particles was found to be undesirable because it agglomerated owing to poor dispersibility in the resin.

It was learned that a metallic copper powder which, like the former powder, has copper particle clusters possessing an appropriate number of neck portions distributed therein can be produced according to the metallic copper powder production process employing wet reduction, by controlling the atmosphere in the initial step for forming copper hydroxide and further controlling impurity content in the step for forming the copper hydroxide. Specifically, it was learned that copper particle clusters having the aforesaid number of neck portions can be produced by a modification of the conventional copper powder production process comprising a step of precipitating copper hydroxide by reacting an aqueous solution of a copper salt and an alkali to obtain a suspension containing copper hydroxide, an intermediate reduction step effected by adding a reducing agent to the suspension to reduce the copper hydroxide to cuprous oxide, and a final reduction step of reducing the cuprous oxide in the suspension to metallic copper using a reducing agent, in which modified process the copper hydroxide precipitating step, conventionally conducted under an inert atmosphere of nitrogen or the like, is instead conducted under an atmosphere of an oxygen-containing gas, typically under an air atmosphere, and the copper hydroxide precipitating step is conducted in an aqueous solution reduced in concentration of co-present impurities such as Mg, Ca, Zn, Na, Al, Fe and the like. Moreover, by blowing an oxygen-containing gas, typically air, into the suspension of cuprous oxide after reduction to cuprous oxide but before final reduction to metallic copper, the particle diameter and particle size distribution of the obtained copper powder can be controlled in proportion to the amount of blown gas.

The process will be explained in further detail. First, in the step of reacting an aqueous solution of a copper salt and alkali to precipitate copper hydroxide, an aqueous solution of copper sulfate can be used as the aqueous solution of a copper salt and an aqueous solution of NaOH can be used as the alkali, as is ordinarily practiced. Alternatively, an aqueous solution of copper chloride, copper carbonate, copper nitrate or the like can be used as the aqueous solution of a copper salt and any of various other alkalis that have no effect on other aspects of the invention process can be used as the alkali. The reaction for precipitating copper hydroxide can be conducted by the method of separately preparing an aqueous solution of copper salt of a certain concentration and an aqueous alkali solution of a certain concentration, mixing the two and then immediately subjecting the mixture to vigorous stirring. Otherwise it can be carried out by the method of continuously adding the aqueous alkali solution to the aqueous solution of a copper salt under stirring. When the copper hydroxide is precipitated under an oxygen-containing gas atmosphere (e.g., air) instead of under the conventional inert gas atmosphere, the intermediate reduction produces cuprous oxide of a relatively large diameter, typically of a particle diameter of about 0.5–1.5 $\mu$m. In contrast, when copper hydroxide is produced under the same conditions except that the precipitation is conducted under a nitrogen atmosphere, cuprous oxide of a small particle diameter of around 0.3 $\mu$m is obtained. When the particle diameter of the cuprous oxide is so small, a metallic copper powder with neck portions as described above is difficult to obtain.

It is also difficult to obtain cuprous oxide of such large diameter when the concentration of impurities such as Mg, Ca, Zn, Na, Al and Fe in the suspension is high. Fe present in the suspension acts especially strongly to prevent formation of large-diameter cuprous oxide particles. The content of these impurities is therefore best reduced to as low as possible. Fe concentration is preferably reduced to a concentration of not greater than 50 ppm and overall impurity concentration is preferably reduced to not greater than 70 ppm, more preferably not greater than 50 ppm.

As such impurities are ordinarily included in the copper salt used as a starting material, a copper salt of the highest purity feasible is preferably selected.

Addition of a reducing agent to the suspension of copper hydroxide suspension in order to reduce the copper hydroxide to cuprous oxide (intermediate reduction) can be conducted by using a glucose as the reducing agent. This intermediate reduction step is preferably carried out under an inert gas atmosphere and increasing temperature. After completion of the intermediate reduction treatment, preferably the atmosphere is replaced with an oxygen-containing gas and oxygen-containing gas is bubbled into the suspension.

While this oxidation treatment conducted after the intermediate reduction makes the pH of the suspension 5–9, the diameter of the copper unit particles at the time of final reduction tends to increase with increasing amount of blown-in oxygen-containing gas. As the amount of blown-in oxygen-containing gas depends on the flow rate and the blow-in period, the diameter of the unit particles can be controlled by adjusting the flow rate and the blow-in period. It was found that unit particles of more uniform diameter, i.e., of a narrow particle size distribution, can be obtained when this oxidation treatment is conducted than when it is not. It was also found that the treatment results in the formation of unit particles of ball-like shape. The amount of blown-in oxygen-containing gas required to achieve these effects can be obtained by adjusting the flow rate and the blow-in period so that the amount of oxygen becomes at least 0.1 mole per mole of copper in the suspension. Although there is no particular upper limit on the amount of blow-in, the effect of oxygen-containing gas blow-in eventually saturates as the amount increases. From the practical viewpoint, and depending on the blow-in method, therefore, an amount of oxygen of not more than 20 moles, or in some cases not more than 10 moles, per mole of copper in the suspension is appropriate. Use of air as the blown-in oxygen-containing gas is most convenient. In the absence of special circumstances, blowing room-temperature air into a room-temperature suspension suffices. Oxygen-enriched air or pure oxygen is, of course, also usable.

The suspension is next decanted under an inert gas atmosphere to remove the supernatant and harvest the precipitants. The precipitants are then re-suspended in water and final reduction to metallic copper is carried out using hydrazine hydrate as the reducing agent. The metallic copper obtained is separated from the liquid and dried, after optional surface treatment for imparting oxidation resistance, to afford a metallic copper powder comprising particles having neck portions.

The present invention thus provides a process for producing copper powder composed of metallic copper particles having neck portions comprising a step of precipitating copper hydroxide by reacting an aqueous solution of a copper salt and an alkali to obtain a suspension containing copper hydroxide, an intermediate reduction step effected by adding a reducing agent to the suspension to reduce the copper hydroxide to cuprous oxide, and a final reduction step of reducing the cuprous oxide in the suspension to metallic copper using a reducing agent, in which process the copper hydroxide precipitating step is conducted under an atmosphere of an oxygen-containing gas, the copper hydroxide precipitating step is conducted in a solution of an Fe concentration of not greater than 50 ppm, and oxidation treatment is conducted after intermediate reduction to cuprous oxide by blowing an oxygen-containing gas into the suspension.

This method enables production of a copper powder comprising copper particle clusters each composed of two or more unit particles joined by neck portions. As this "necked" copper powder makes a paste excellent in conductivity, it can be advantageously used to produce a conductive paste for use in applications that place utmost priority on conductivity improvement. As such, it fulfills the first object of the present invention.

However, such a copper powder composed solely of copper particle clusters, particularly one that, as illustrated in FIGS. 1 and 2, is composed solely of copper particle clusters whose neck portions are smaller in diameter than the unit particles, exhibits inferior dispersibility in resin and a paste produced from the copper powder therefore generally has higher viscosity than a paste produced from a copper powder without necks. Such a copper powder is therefore not appropriate for applications in which paste fluidity is of primary importance. For instance, it is not appropriate for a paste to be charged into the through-holes or via holes of stacked circuit boards because the paste has poor filling property with respect to such fine holes.

Further research was therefore conducted regarding how to improve the dispersibility in resin of a copper powder composed of copper particle clusters having neck portions while maintaining the conductivity improving effect thereof to the utmost possible (i.e., how to achieve the second object of the invention). As a result, it was discovered that the second object of the invention can be achieved by mixing a copper powder composed of copper particle clusters having necks (copper particle clusters/powder A) and spherical metallic particles of small diameter, e.g., spherical copper particles or copper particles coated with silver (spherical metallic particles/powder B), while appropriately controlling the average particle diameter and mixing ratio of the two types of particles.

It was further found that still better results can be obtained by mixing the spherical metallic powder B with a necked copper powder A composed of smoothed clusters whose angular surface irregularities have been removed by surface smoothing treatment beforehand. The surface smoothing treatment of the necked copper powder is preferably conducted by the method of causing mechanical contact among the copper particle clusters A. As set out in the working examples explained later, a cylindrical high-speed agitator, for example, can be advantageously used for this purpose. When the copper particle clusters A are ones that have been subjected to surface smoothing treatment, the copper particle clusters may be present whose neck diameter is greater than the diameter of at least one of the unit particles at opposite ends of the neck portion.

In implementing this aspect of the invention, a paste that exploits the excellent conductivity of necked copper powder and also exhibits markedly low viscosity can be obtained by producing copper powder consisting of copper particle clusters A individually composed of two or more unit particles joined through neck portions, mixing the copper powder consisting of copper particle clusters A and a spherical metallic powder consisting of spherical metallic particles B of a smaller diameter than the copper particle clusters A at a rate such that the weight ratio of B to A (B/A) is in the range of 1/19 to 3/5 and the particles B can enter spaces between the particles A. Particularly preferable is to establish a relationship wherein the average particle diameter $D_A$ of the particles A is in the range of 4–8 $\mu$m, preferably 5–7 $\mu$m, and the average particle diameter $D_B$ of the spherical metallic particles B is such that $D_A/D_B$ is in the range of 5/4 to 8/1, preferably 5/3 to 7/1. When the ratio falls below this range, the paste viscosity lowering effect obtained by mixing in the spherical metallic particles B is low and the electrical resistance is high. When the ratio is above this range, the paste dispersion property is poor because the particles B are of such small diameter as to readily give rise to agglomeration.

When the weight ratio B/A is smaller than 1/19, the spherical metallic particles B do not produce a sufficient paste viscosity lowering effect, and when it is greater than 3/5, the electrical resistance rises to a level that diminishes the technical advantage of using the copper particle clusters A. Typically, the average particle diameter $D_A$ of the particles A is 4–8 $\mu$m and the average particle diameter $D_B$ of the spherical metallic particles B is not less than $D_A \times 1/7$ and not greater than $D_A \times 3/5$, and the weight ratio B/A is preferably in the range of 1/19 to 3/5.

The spherical metallic particles B are preferably spherical copper particles or spherical silver-coated copper particles. A particularly marked reduction of electrical resistance can be realized by using spherical silver-coated copper particles. The spherical silver-coated copper particles can be obtained by coating the surfaces of spherical copper particles with silver. The silver coating can be effected using silver complex salt solution with EDTA (ethylenediamine-tetraacetic acid) or by the method of adding silver nitrate to the suspension including suspended spherical copper particles obtained in the final step of the wet reduction process. Spherical copper particles without neck portions can be produced by conducting the initial step for forming copper hydroxide under an inert atmosphere instead of under the oxidizing atmosphere used when producing necked copper powder. The average diameter of the spherical copper particles can be controlled by controlling the amount of blown-in air in the bubbling step. This enables production of spherical copper powders of various average particle diameters and uniform particle size.

"Spherical metallic particles B" as termed with respect to the present invention is, as is usual in this technical field, defined to include not only perfectly spherical bodies but also bodies of overall spherical (ball-like) shape as distinguished from particles of other shapes such as plate or needle like, and it should be understood that the term encompasses ball-like bodies whose surfaces exhibit irregularities and/or angular protrusions to some degree insofar as they are spherical as a whole.

WORKING EXAMPLES

Example 1

The following aqueous solution of copper sulfate A and aqueous solution of alkali B were prepared.

Aqueous solution of copper sulfate A:

($CuSO_4 \cdot 5H_2O$: 0.6925 Kg)+(Pure water: 2.20 Kg)

Aqueous solution of alkali B:

(Aqueous solution of NaOH of 48.1% concentration: 0.545 Kg)+(Pure water: 4.15 Kg)

The total amount of aqueous solution of copper sulfate A held at 29° C. was added to the aqueous solution of alkali B held at 27° C. in an air atmosphere and stirred. The Fe concentration of the solution was no greater than 50 ppm and other impurities were present only in trace amounts. The temperature of the A+B solution was increased to 32° C. by heat of the reaction. A suspension containing precipitated copper hydroxide was obtained. The pH of the solution was 13.2. The mixing ratio of the A solution and B solution was such to make NaOH present at a chemical equivalent ratio of 1.20 relative to copper contained in the solution.

A glucose solution prepared by dissolving 0.9935 Kg of a glucose in 1.41 Kg of pure water was added to the total amount of copper hydroxide suspension obtained. The solution rose to a temperature of 70° C. over a 38-min period following the addition and was maintained at this temperature for 15 min thereafter. The pH of the suspension at this time was 7.8. This step was conducted under a nitrogen atmosphere.

The suspension was then oxidized by bubbling air into it at a flow rate of 0.7 liter/min over a period of 420 min. The pH of the suspension became 5.76 as a result. The diameter of the cuprous oxide particles was about 0.7 $\mu$m.

The suspension was left standing in a nitrogen atmosphere for two days. The supernatant (pH 5.99) was then removed to harvest substantially the total amount of the precipitated cuprous oxide. A suspension was prepared by adding 0.55 Kg of pure water to the precipitate. 0.074 Kg of hydrazine hydrate was added to the total amount of the suspension in several lots. The temperature of the suspension rose from 50° C. to a final temperature of 80° C. owing to heat generated up to completion of the reaction. Upon completion of the reaction, the suspension was subjected to solid-liquid separation and a copper powder was obtained by drying the harvested solid content at 120° C. under a nitrogen atmosphere.

An SEM image of the copper powder obtained by this method is shown in FIGS. 1 and 2. As explained earlier, the copper powder contained copper particle clusters individually composed of unit particles of 2.5–5.0 $\mu$m diameter joined through neck portions. Based on a count of the copper particle clusters in the SEM, about 40% of all particles were accounted for by the copper particle clusters.

A paste was prepared in accordance with the conventional method of preparing a copper-system conductive paste, by kneading together 30 g of the copper powder and 7.5 g of phenolic resin as a thermosetting resin. A 30 $\mu$m-thick coat of the blended material was applied to a glass plate and dried. The volume resistivity of the coat was $3.12 \times 10^{-3}$ $\Omega \cdot$cm.

Comparative Example 1

The following aqueous solution of copper sulfate A and aqueous solution of alkali B' were prepared.
Aqueous solution of copper sulfate A:

($CuSO_4 \cdot 5H_2O$: 0.6925 Kg)+(Pure water: 2.20 Kg)

Aqueous solution of alkali B':

(Aqueous solution of NaOH of 49.0% concentration: 0.541 Kg)+ (Pure water: 4.15 Kg)

The total amount of aqueous solution of copper sulfate A held at 29° C. was added to the aqueous solution of alkali B' held at 27° C. in a nitrogen gas atmosphere and stirred. The Fe concentration of the solution was no greater than 50 ppm and other impurities were present only in trace amounts. The temperature of the A+B' solution was increased to 32.9° C. by heat of the reaction. A suspension containing precipitated copper hydroxide was obtained. The pH of the solution was 12.9. The mixing ratio of the A solution and B' solution was such to make NaOH present at a chemical equivalent ratio of 1.19 relative to copper contained in the solution.

A glucose solution prepared by dissolving 0.9935 Kg of a glucose in 1.41 Kg of pure water was added to the total amount of copper hydroxide suspension obtained. The solution rose to a temperature of 70° C. over a 38-min period following the addition and was maintained at this temperature for 15 min thereafter. The pH of the suspension at this time was 7.8. This step was conducted under a nitrogen atmosphere.

The suspension was then oxidized by bubbling air into it at a flow rate of 0.7 liter/min over a period of 420 min. The pH of the suspension became 5.80 as a result. The diameter of the cuprous oxide particles was about 0.3 $\mu$m.

The suspension was left standing in a nitrogen atmosphere for two days. The supernatant (pH 6.02) was then removed to harvest substantially the total amount of the precipitated cuprous oxide. A suspension was prepared by adding 0.55 Kg of pure water to the precipitate. 0.074 Kg of hydrazine hydrate was added to the total amount of the suspension in several lots. The temperature of the suspension rose from 50° C. to a final temperature of 80° C. owing to heat generated up to completion of the reaction. Upon completion of the reaction, the suspension was subjected to solid-liquid separation and a copper powder was obtained by drying the harvested solid content at 120° C. tinder a nitrogen atmosphere.

An SEM image of the copper powder obtained by this method is shown in FIGS. 3 and 4. As explained earlier, the copper powder was composed of ball-like particles of an average diameter of about 6.0 $\mu$m. No neck portions were present.

A paste was prepared in exactly the same way as in Example 1, by kneading together 30 g of the copper powder and 7.5 g of phenolic resin as a thermosetting resin. A 30 $\mu$m-thick coat of the blended material was applied to a glass plate and dried. The volume resistivity of the coat was $2.76 \times 10^{-2}$ $\Omega \cdot$cm.

Example 2

A necked copper powder comprising copper particle clusters obtained in the manner of Example 1 was charged into a cylindrical high-speed agitator and subjected to forced-flow treatment for smoothing the particle surfaces under a nitrogen atmosphere. The cylindrical high-speed agitator used for the forced-flow treatment was a mixer having two rotary blades at the bottom of a vertically disposed cylindrical vessel. Centrifugal force imparted by the rotating blades caused the powder to flow upward and its particles to repeatedly collide with one another during the flow period, thereby smoothing off protrusions on the particles surfaces. The treatment leveled the angular irregularities present on the unit particle surfaces to afford particles of an overall rounded shape but caused almost no breakup of the copper particle clusters by separation of unit particles at the neck portions. As the neck portions remained, the copper particle clusters could be distinguished from spherical particles.

The average diameter of the copper particle clusters after the smoothing treatment was 6 $\mu$m. The helos particle size distribution of the copper powder was measured using a helos particle size distribution measuring device (Helos H0780; Sympatic Co., Ltd.). Particles of a diameter of 4–7 $\mu$m were found to account for 70 vol % of all particles. As most particles thus fell in the 4–7 $\mu$m range centered on 6 $\mu$m, the particle size distribution was very narrow.

Metallic powders No. 1–16 listed in Table 1 were prepared by thoroughly mixing the copper powder composed of the smoothed copper particle clusters with different metallic powders composed of spherical copper particles or spherical silver-coated copper particles, at the mixing ratios indicated in the same table. SEM images of the No. 4, No. 6, No. 7 and No. 10 mixed powders, considered representative of the sixteen mixed powders prepared, are shown in FIGS. 5, 6, 7 and 8, respectively.

The spherical powders composed of the spherical copper particles of different average particle diameter shown in Table 1 were prepared to consist of ball-like copper particles (i.e., spherical copper particles without neck portions) of uniform size by a method similar to that of Example 1, except that the addition of the aqueous solution of copper sulfate A to the aqueous alkali solution B was conducted under a nitrogen atmosphere instead of an air atmosphere and the conditions of the air bubbling step were modified. The spherical silver-coated copper particles were produced by using a solution of silver complex salt with EDTA to deposit a thin film of silver on the surface of spherical copper particles.

The spherical powders composed of spherical copper particles in column (a) of Table 1 were ones subjected to the surface smoothing treatment explained earlier. The spherical powders composed of the spherical silver-coated copper particles in column (b) of Table 1 were ones obtained by silver coating copper powders composed of smoothed spherical copper particles.

The viscosities (F value=92 or 93) and electrical resistances of pastes in which the No. 1–16 mixed metallic powders were dispersed were measured in the following manner. The results of the measurements are included in Table 1.

Filler value (F value=92): 92 wt % of the mixed powder was kneaded into 8 wt % of epoxy resin in a vibration type mixer and the viscosity of the obtained paste was measured. The epoxy resin used (glycidyl-esterfied dimer acid) had an epoxy equivalent of 446 g/eq and a 25° C. viscosity of 730 mPa·s. The kneading conditions were the same for all copper powders. Paste viscosity was measured using a B type viscometer at 10 rpm and 25° C.

Filler value (F value=93): The viscosity of a paste similarly prepared from 93 wt % of the mixed powder and 7 wt % epoxy resin was measured in the same manner.

Powder resistance: The copper powder was charged into a 2-mm diameter round cylinder made of insulating material and the copper powder was applied with a load progressively increased from 0 and 150 kgf. The resistance to passage of electric current at a load of 25 kgf was defined as the electrical resistance value of the copper powder.

particle clusters A of an average diameter of 6 μm, paste viscosity decreased with increasing content of spherical copper particles B up to 30 wt % content, whereafter the viscosity decreasing effect saturated and electrical resistance increased.

(6) Paste viscosity decreasing effect and powder resistance decreasing effect were greater when spherical particles B (type (a) copper particles) of an average diameter of 1.5 μm were mixed with the copper particle clusters A of an average diameter of 6 μm than when spherical particles B (type (a)) of an average diameter of 3 μm were mixed therewith. In the case of No. 7, for instance, both paste viscosity decreasing effect and electrical resistance decreasing effect were very pronounced.

(7) When spherical particles B of type (b) (spherical silver-coated copper particles) were used, decreased paste viscosity was obtained and, in addition, a greater decrease in electrical resistance was realized than when using spherical particles B of type (a) (copper particles).

TABLE 1

Figure 5:
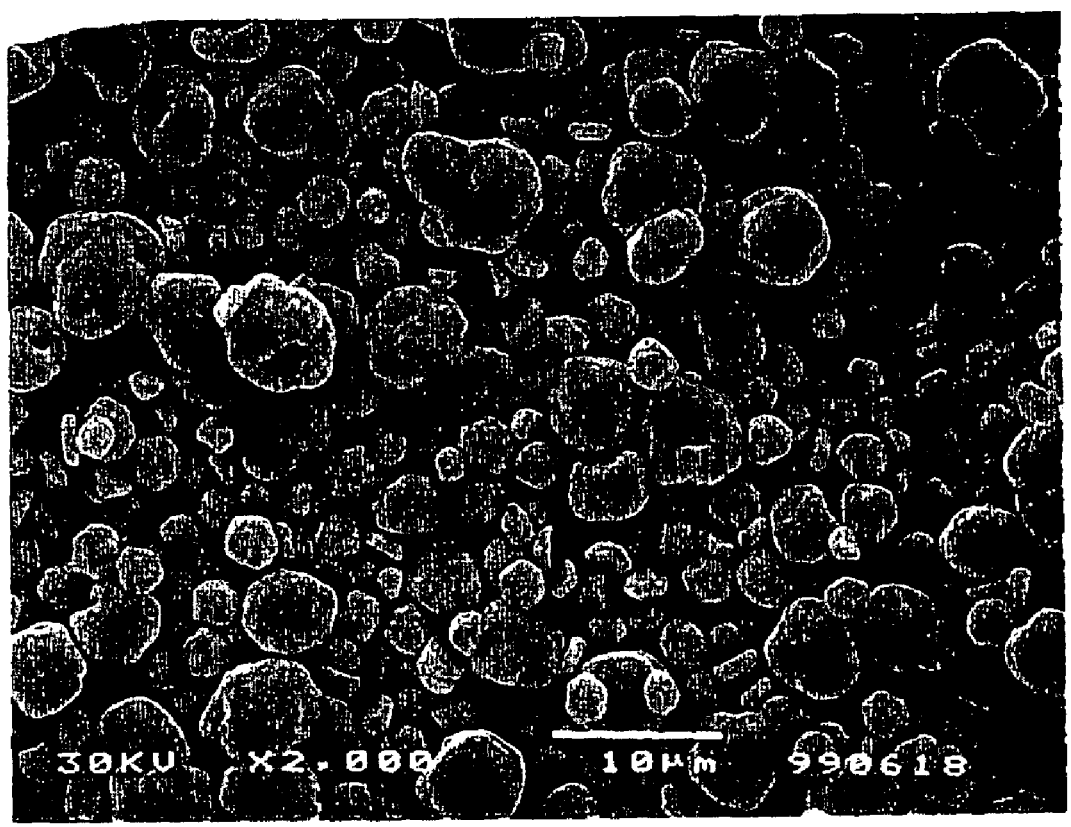
FIG. 5 is an SEM image of mixed powder No. 4 obtained in Example 2 according to the invention.
Figure 6:
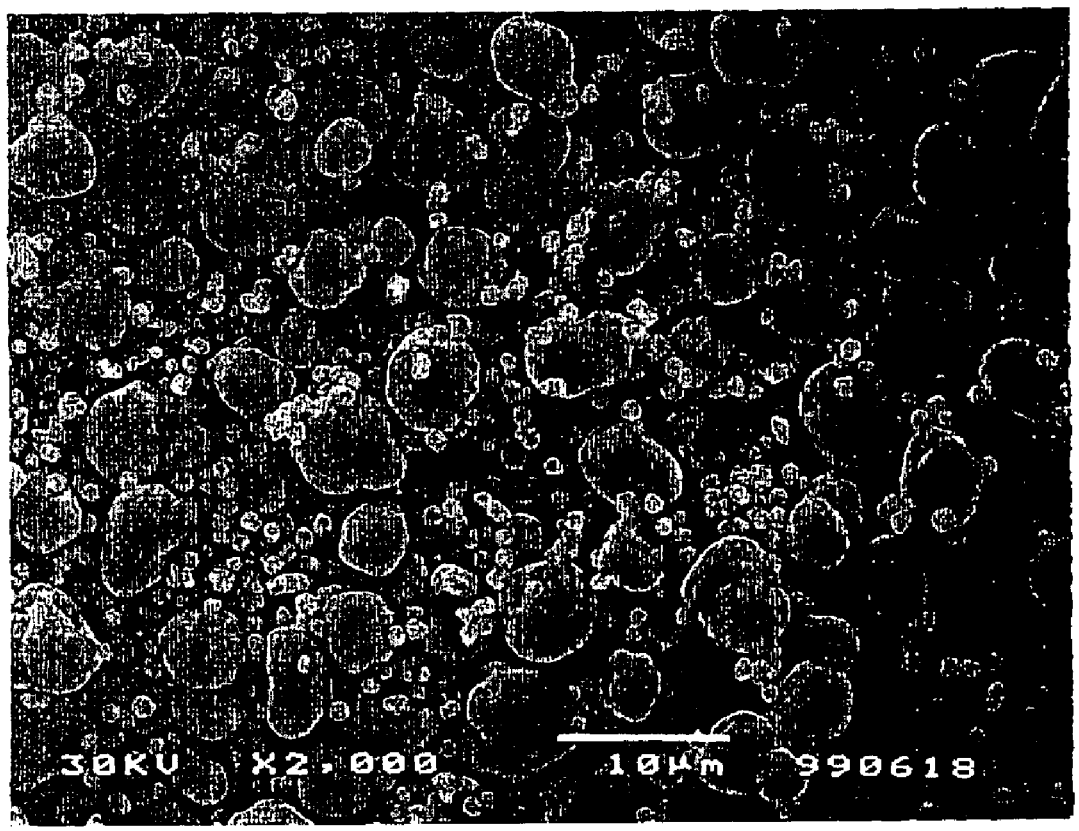
FIG. 6 is an SEM image of mixed powder No. 6 obtained in Example 2.
Figure 7:
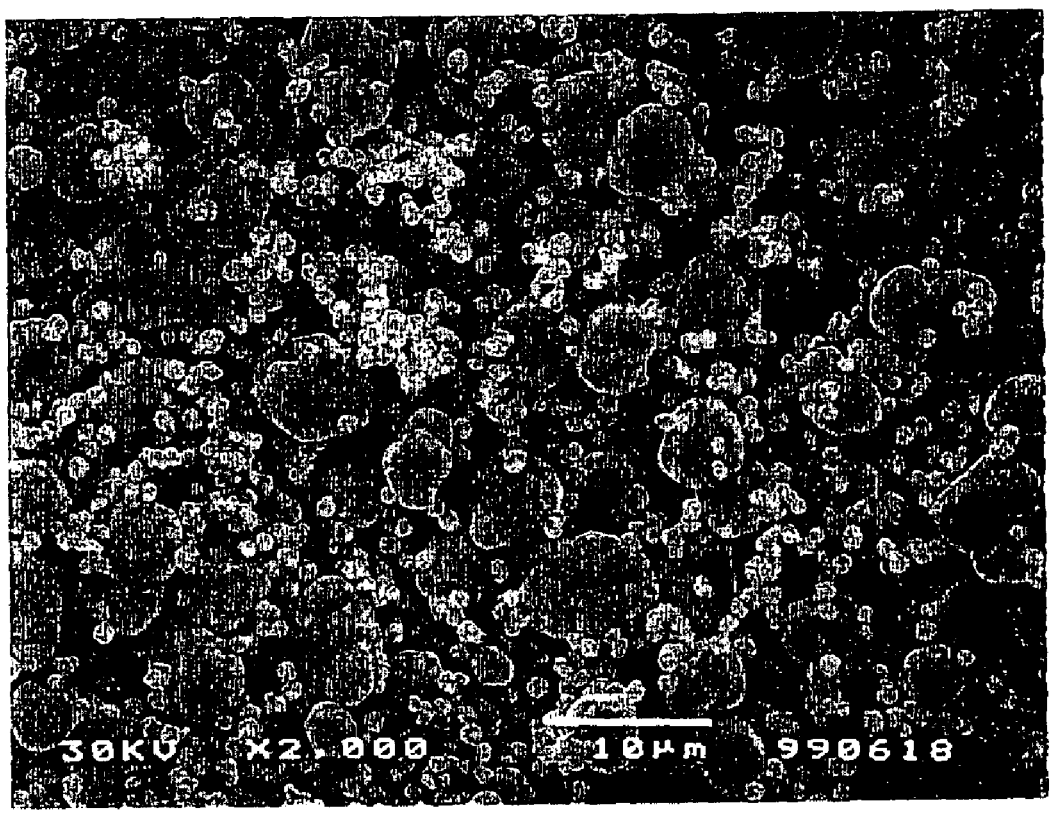
FIG. 7 is an SEM image of mixed powder No. 7 obtained in Example 2.
Figure 8:
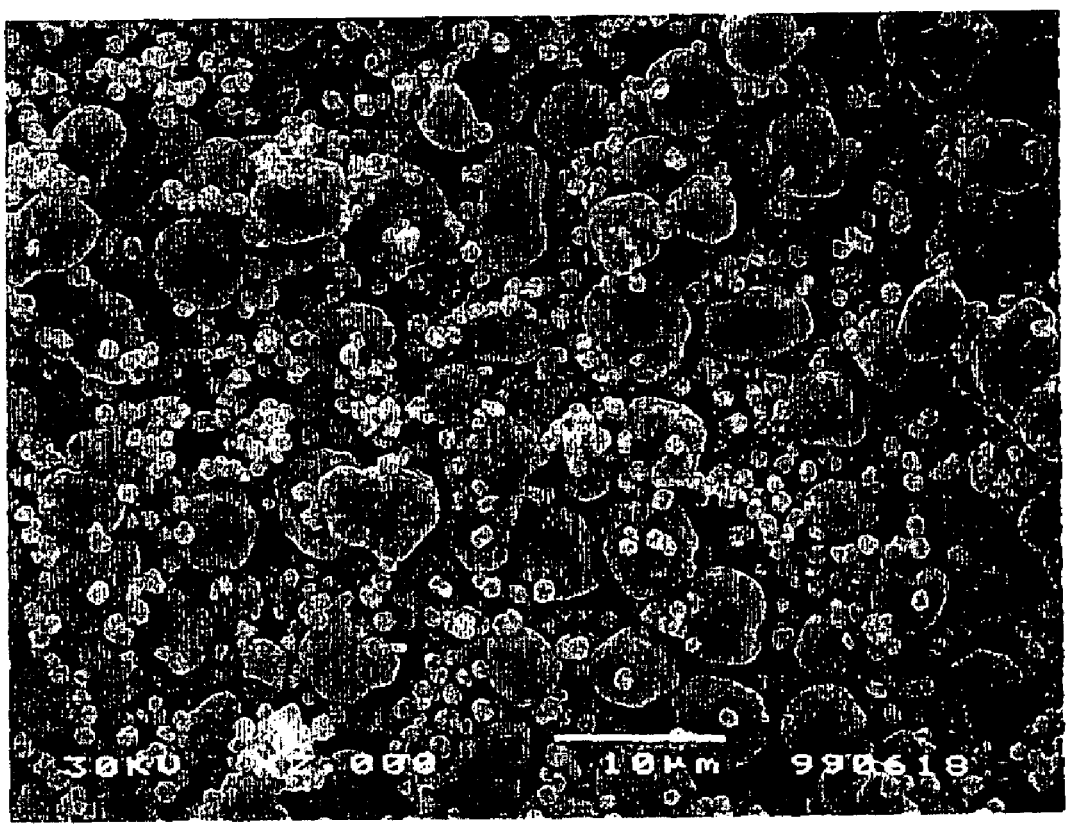
FIG. 8 is an SEM image of mixed powder No. 10 obtained in Example 2.

| No. | Copper particle clusters (A) Smoothed copper particle clusters Diameter | Wt % | Sperical powder (B) (a) Spherical copper particles Diameter | Wt % | (b) Spherical silver-coated copper particles Diameter | Wt % | Paste viscosity F92 value Pa·s | F93 value Pa·s | Electrical resistance Powder resistance mΩ | Photo | Remark |
|---|---|---|---|---|---|---|---|---|---|---|---|
| 1 | 6 | 100 | — | — | — | — | 127 | 1041 | 126 | | Control |
| 2 | 6 | 90 | 3 | 10 | — | — | 65 | 213 | 34 | | |
| 3 | 6 | 80 | 3 | 20 | — | — | 58 | 159 | 113 | | |
| 4 | 6 | 70 | 3 | 30 | — | — | 55 | 138 | 220 | FIG. 3 | |
| 5 | 6 | 95 | 1.5 | 5 | — | — | 56 | 116 | 31 | | Invention |
| 6 | 6 | 90 | 1.5 | 10 | — | — | 46 | 79 | 37 | FIG. 4 | Examples |
| 7 | 6 | 80 | 1.5 | 20 | — | — | 38 | 57 | 27 | FIG. 5 | |
| 8 | 6 | 95 | — | — | 1.5 | 5 | 56 | 116 | 24 | | |
| 9 | 6 | 90 | — | — | 1.5 | 10 | 48 | 82 | 18 | | |
| 10 | 6 | 80 | — | — | 1.5 | 20 | 35 | 54 | 20 | FIG. 6 | |
| 11 | — | — | 6 | 100 | — | — | 74 | 131 | 170 | | Comparative |
| 12 | — | — | 6 | 80 | — | — | 58 | 115 | 160 | | Examples |
| | | | 1.5 | 20 | | | | | | | |
| 13 | 6 | 80 | 4.5 | 20 | — | — | 65 | 232 | 199 | | |
| 14 | 6 | 80 | 5 | 20 | — | — | 116 | 850 | 220 | | |
| 15 | 6 | 80 | 10 | 20 | — | — | 227 | | 250 | | |
| 16 | 6 | 80 | 20 | 20 | — | — | 173 | | 300 | | |

The results shown in Table 1 demonstrate that:
(1) No. 1 composed solely of smoothed copper particle clusters A exhibited lower electrical resistance and higher paste viscosity than No. 11 composed solely of spherical particles B (type (a) copper particles) of the same diameter.
(2) As can be seen from Nos. 2–10, paste viscosity decreased when spherical particles B (either type (a) or type (b)) of a smaller diameter were mixed with the copper particle clusters A of larger diameter.
(3) As can be seen from No. 2 and Nos. 5–10, electrical resistance decreased when spherical particles B (either type (a) or type (b)) of a smaller diameter were mixed with the copper particle clusters A of a larger diameter.
(4) As can be seen from Nos. 14–16, paste viscosity did not decrease but rather increased and electrical resistance also increased when spherical particles B (type (a) copper particles) of an average diameter of 5 μm or greater were mixed with the copper particle clusters A of an average diameter of 6 μm.
(5) When spherical particles B (type (a) copper particles) of an average diameter of 3 μm were mixed with the copper As explained in the foregoing, the present invention provides a copper powder for conductive paste capable of forming a coating excellent in electrical conductivity. The present invention also provides a conductive filler for conductive paste that enables simultaneous reduction of both electrical resistance and paste viscosity. A conductive paste prepared using this conductive filler has low viscosity and exhibits excellent conductivity in the hardened state. When applied, for example, as a conductive paste for charging into the through-holes and via holes of stacked (multi-layer) circuit boards, it therefore exhibits outstanding properties not obtainable with conventional conductive pastes. The present invention can therefore be expected to contribute greatly to improvement of the performance of multi-layer circuit boards for high-density component mounting.

What is claimed is:
1. A conductive filler for conductive paste consisting essentially of a mixture of copper particle clusters A individually composed of two or more unit particles joined through neck portions and spherical metallic particles B of smaller diameter than the particles A.
2. A conductive filler according to claim 1, wherein the spherical metallic particles B are mixed with the copper particle clusters A at a rate such that the weight ratio of B to A (B/A) is in the range of 1/19 to 3/5.

3. A conductive filler according to claim 1, wherein the ratio of the average particle diameter $D_A$ of the copper particle clusters A to the average particle diameter $D_B$ of the spherical metallic particles B ($D_A/D_B$) is in the range of 5/4 to 8/1.

4. A conductive filler according to claim 1, wherein the spherical metallic particles B are copper particles or copper particles coated with silver.

5. A conductive filler according to claim 3, wherein the average particle diameter $D_A$ of the copper particle clusters A is in the range of 4–8 μm.

6. A conductive filler according to claim 1, wherein the copper powder composed of the copper particle cluster A is one that has been subjected to surface smoothing treatment by causing mechanical contact among the copper particle clusters A.

7. A conductive paste comprising a binder resin and, dispersed in the binder resin, a metallic powder comprising a copper powder including copper particle clusters A individually composed of two or more unit particles joined through neck portions and spherical metallic particles B of smaller diameter than the particles A, particles B being present in spaces between particles A.

8. A conductive paste according to claim 7, wherein the binder resin is a thermosetting resin.

* * * * *